United States Patent [19]

Kushner

[11] Patent Number: 5,303,412

[45] Date of Patent: Apr. 12, 1994

[54] COMPOSITE DIRECT DIGITAL SYNTHESIZER

[75] Inventor: Lawrence J. Kushner, Andover, Mass.

[73] Assignee: Massachusetts Institute of Technology, Cambridge, Mass.

[21] Appl. No.: 851,481

[22] Filed: Mar. 13, 1992

[51] Int. Cl.$^5$ ............................................ H03D 7/16
[52] U.S. Cl. ................................. 455/260; 455/33.1; 455/304; 455/76; 331/40; 332/103
[58] Field of Search .................. 455/76, 89, 258, 259, 455/260, 304, 33.1; 331/37, 38, 40, 42, 43; 328/307; 332/103

[56] References Cited

U.S. PATENT DOCUMENTS

| | | | |
|---|---|---|---|
| 2,927,280 | 3/1960 | Cumming | 331/42 |
| 3,749,837 | 7/1973 | Doughty | 179/1 J |
| 4,761,798 | 8/1988 | Griswold, Jr. et al. | 375/59 |
| 4,926,130 | 5/1990 | Weaver | 331/38 |
| 5,063,361 | 11/1991 | Smith et al. | 332/103 |

FOREIGN PATENT DOCUMENTS

0419680A1 4/1991 European Pat. Off. .

OTHER PUBLICATIONS

Ladimer S. Nagurney, "A Multi-Emission Frequency Domain Modulator," 40th IEEE Vehicular Technology Conference, 6 May 1990, Orlando, Fla., pp. 71–74.
Marketing Brochure, "Direct Digital Synthesis: 21 Questions and Answers for RF Engineers", QUAL-COMM. Inc. 1990.
R. C. Cumming, "The Serrodyne Frequency Translator", Proc. IRE, pp. 175–186 (Feb. 1957).
H. T. Nicholas, III et al., "An Analysis of the Output Spectrum of Direct Digital Frequency Synthesizers in the Presence of Phase-Accumulator Truncation", 41st Annual Frequency Control Symposium pp. 495–501 (1987).
G. Van Andrews et al., "A Monolithic Digital Chirp Synthesizer Chip with I and Q Channels", GaAs IC Symposium, pp. 19–22 (1991).
Advertisement, "Phase Shifter is Doppler Simulator", Sciteq Electronics, Inc.
R. C. Cumming, Serrodyne Performance and Design, (1965) pp. 83–87.
G. Klein and L. Dubrowsky, *IEEE Transactions on Microwave Theory and Techniques,* vol. MMT-15:3 (1967).
M. Greenbaum et al., *IEEE Transactions on Aerospace and Electronic Systems,* (Jul. 1974).
Vadim Manassewitsch, *Frequency Synthesizers Theory and Design,* publication of Wiley & Sons, (1976).
M. Topi, *An Eight-Phase Broadband Serrodyne Modulator,* IEEE MTT-S Digest (1983).
H. Yuan et al., *The Development of Heterojunction Integrated Injection Logic,* IEEE Transactions on Electron Devices, 36:10, Oct. 1989.
S. Mitchell et al., *Wideband Serrodyne Frequency Translator,* Applied Microwave, (1990).
K. C. Wang et al., *Diode-HBT-Logic Circuits Monolithically Integrable with ECL/CML Circuits,* GaAs IC Symposium, (1991).
D. Helms et al., *Wideband Very Fast Set-on Receiver,* GaAs IC Symposium (1990).
Stanford Telecom, *Products for Direct Digital Synthesis,* Advertisement (1991).
Stanform Telecom, 0–400 MHz GaAs *Direct Digital Phase Modulated Synthesizer Hybrid STEL-2373,* Marketing Brochure, 1991.

*Primary Examiner*—Reinhard J. Eisenzopf
*Assistant Examiner*—Philip J. Sobutka
*Attorney, Agent, or Firm*—Hamilton, Brook, Smith & Reynolds

[57] ABSTRACT

A low-power digital frequency synthesizer combining direct digital frequency synthesis techniques with serrodyne frequency translation principles to produce a wideband frequency response with high spectral purity. A conventional direct digital synthesizer is used to generate a high-resolution analog carrier signal from a low-speed digital clock signal. The carrier signal is phase modulated by a low-resolution signal generated from a high-speed digital clock signal. The modularity signal is a higher frequency signal than the carrier signal. The phase modulation is accomplished by exact decoded attenuators. The spectral purity of the resulting high-resolution output signal is unobtainable by conventional direct digital synthesizers, while providing significant power savings.

59 Claims, 10 Drawing Sheets

COMPOSITE DIRECT DIGITAL SYNTHESIZER

GOVERNMENT SUPPORT

The invention described herein was supported in whole or in part by Contract Number F19628-90-C-0002 from the Department of the Army.

BACKGROUND OF THE INVENTION

Digital frequency synthesizers are replacing oscillators in a number of important applications such as frequency generating subsystems, test equipment and communication systems. In particular, many communication systems use complex modulation schemes which are often more easily implemented using digital frequency synthesis.

Battery-powered communication systems using spread spectrum technology are one category of applications that benefit from digital frequency synthesis. This category includes cellular telephone systems and ground terminal communication systems. Such applications may use frequency hopping techniques to spread a signal over the channel bandwidth. These applications will benefit from a low-power, wideband frequency synthesizer with high spectral purity. Current technology has failed to achieve those goals.

One existing device is the direct digital synthesizer (DDS). Conventionally, a high-resolution DDS generates wideband analog signals using a high-speed digital clock. For example, frequency responses up to 400 MHz have been demonstrated using a 1 GHz clock. However, due to phase truncation effects, amplitude quantization effects, and digital-to-analog converter (DAC) nonlinearities and glitches, a large number of high level spurious signals are present in the output frequency band. These spurious signals increase with the clock frequency.

In addition to spectral purity problems, conventional DDSs suffer from hardware constraints. Because of the high clock frequencies, conventional high-speed DDSs are fabricated in Gallium Arsenide (GaAs). Furthermore, the conventional DDS dissipates higher power when driven at high clock frequencies.

Serrodyne modulators have been used to modulate high frequency analog signals by lower frequency digital signals. For example, this technique is used to generate frequency chirps for radar systems. The resulting frequency translation is relatively narrow band, typically less than one octave. In addition, the resulting signal has mediocre near carrier, spurious performance, typically −15 to −30 dBc. The use of analog devices to generate the phase shifts further limits performance.

SUMMARY OF THE INVENTION

A direct digital frequency synthesizer for generating a wideband high-resolution frequency response. A low-speed, high-resolution direct digital synthesizer and a low pass filter are used to generate a narrow-band, high-resolution frequency response. A phase shifter modulates the high resolution frequency by a high frequency signal. The high frequency signal is provided by a high-speed, low-resolution phase accumulator clocked at a high frequency. The phase shifter uses a serrodyne vector modulation technique to generate a high resolution frequency with a wideband frequency response. The present composite direct digital synthesizer provides a portable, battery powered generator having the speed, bandwidth and resolution that is normally associated with much heavier and high power consuming systems. By utilizing a circuit in which only a small portion of the device is required to clock at a high speed, it is possible to substantially reduce the DC power necessary to operate the device. This system also substantially reduces or eliminates phase truncation effects, amplitude quantization effects, and DAC nonlinearities and glitches found in conventional systems.

The invention can also be fabricated in a single chip or in a multi-chip module to provide for assembly in portable battery powered communication systems requiring more complex modulation. The system meets the low power and high spectral purity requirements for portable ground terminal and space applications as well as for cellular telephone networks.

DESCRIPTION OF A PREFERRED EMBODIMENT

A preferred embodiment of the present invention combines direct digital frequency synthesis techniques with the serrodyne frequency translation principle to create digitally synthesized frequencies. A preferred embodiment obtains a wideband frequency response with high spectral purity. Because phase shifts are generated digitally using wideband attenuators and switches, the invention obtains spectral purity unobtainable through purely analog means. A preferred embodiment achieves a wideband, high-resolution frequency synthesis while consuming low power.

Figure 1:
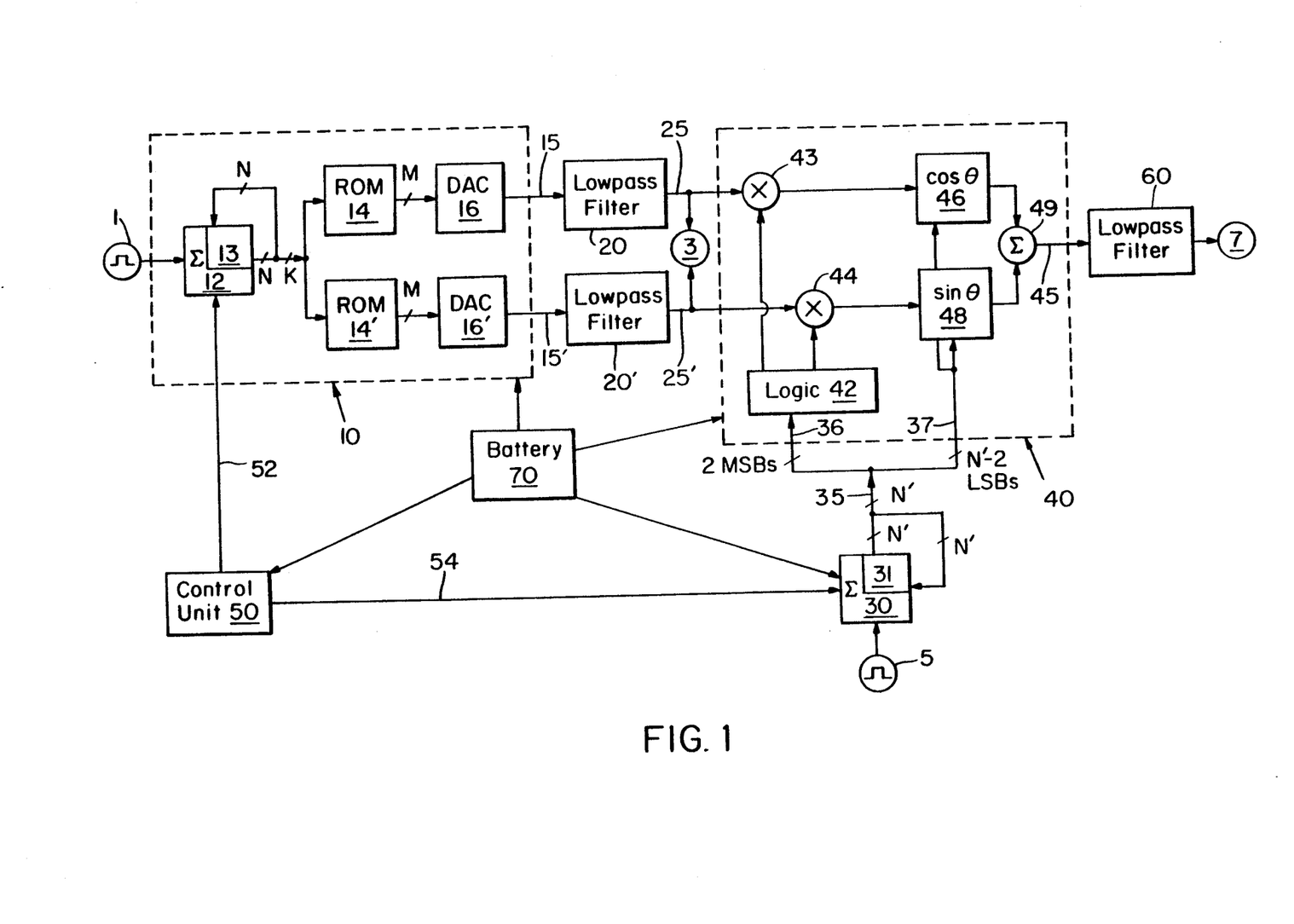
FIG. 1 is a block diagram of a preferred embodiment of the invention.

FIG. 1 shows a simplified block diagram of a preferred embodiment. The system generates an output signal 7 of frequency $f_o$ from two periodic clock signals 1,5. Clock 1 generates periodic digital clock pulses with frequency, $f_r$, less than $f_o$. The invention uses clock 1 to generate a carrier signal, c(t), with a real value expressed as $$c(t) = a_c(t) \sin [2\pi f_c t + \phi(t)]; \quad \text{(equation 1)}$$

where $a_c(t)$ denotes the amplitude of c(t) and $\phi(t)$ denotes the phase of c(t). In addition, clock 5 generates periodic digital clock pulses with frequency, $f_r'$, greater than $f_o$ and greater than or equal to $4f_c$. The invention uses clock 5 to phase modulate the carrier signal to produce an output signal, o(t), of the form $$o(t) = a_o(t) \sin[2\pi f_c t + \Theta(t)]; \qquad \text{(equation 2)}$$

$a_o(t)$ denotes the amplitude of the output signal and $\Theta(t)$ denotes the periodic phase modulation. In contrast to a conventional modulator, the carrier signal is being modulated by a relatively high frequency signal.

A control unit 50 provides the composite DDS with an external interface compatible with conventional DDS interfaces. The control unit 50 supplies the high-speed phase accumulator 30 with the low-resolution phase data using data bus 54 and the low-speed phase accumulator 12 with the high-resolution phase data using data bus 52. In a preferred embodiment, the frequency of the high-speed clock 5 is power of 2 multiple of the frequency of the low-speed clock 1. The most significant bits (MSBs) represent the low-resolution phase data and the least significant bits (LSBs) represent the high-resolution phase data.

On every clock pulse of clock 1, the low-speed phase accumulator 12 increments its N-bit data register 13 by an increment value, I, selected by control unit 50 based upon the selected carrier signal frequency. This increment value is applied on data bus 52 from control unit 50. The control unit 50 computes the increment value such that the phase accumulator's data register I3 overflows with the same frequency as the frequency of the carrier signal, $f_c$. The equation for computing the phase increment value for an N-bit phase accumulator is given by $$I = 2^N \left( \frac{f_c}{f_r} \right) \qquad \text{(equation 3)}$$

where $f_c$ denotes the frequency of the carrier signal output from the DDS 10 and $f_r$ denotes the frequency of the clock. Thus the control unit 50 changes the carrier frequency by changing the increment value. Because an analog signal is being generated from the digital clock 1, the carrier signal 3 frequency, $f_c$, is limited to the Nyquist frequency of the clock 1 (i.e. $f_c$ must be less than or equal to $f_r/2$).

Figure 2:
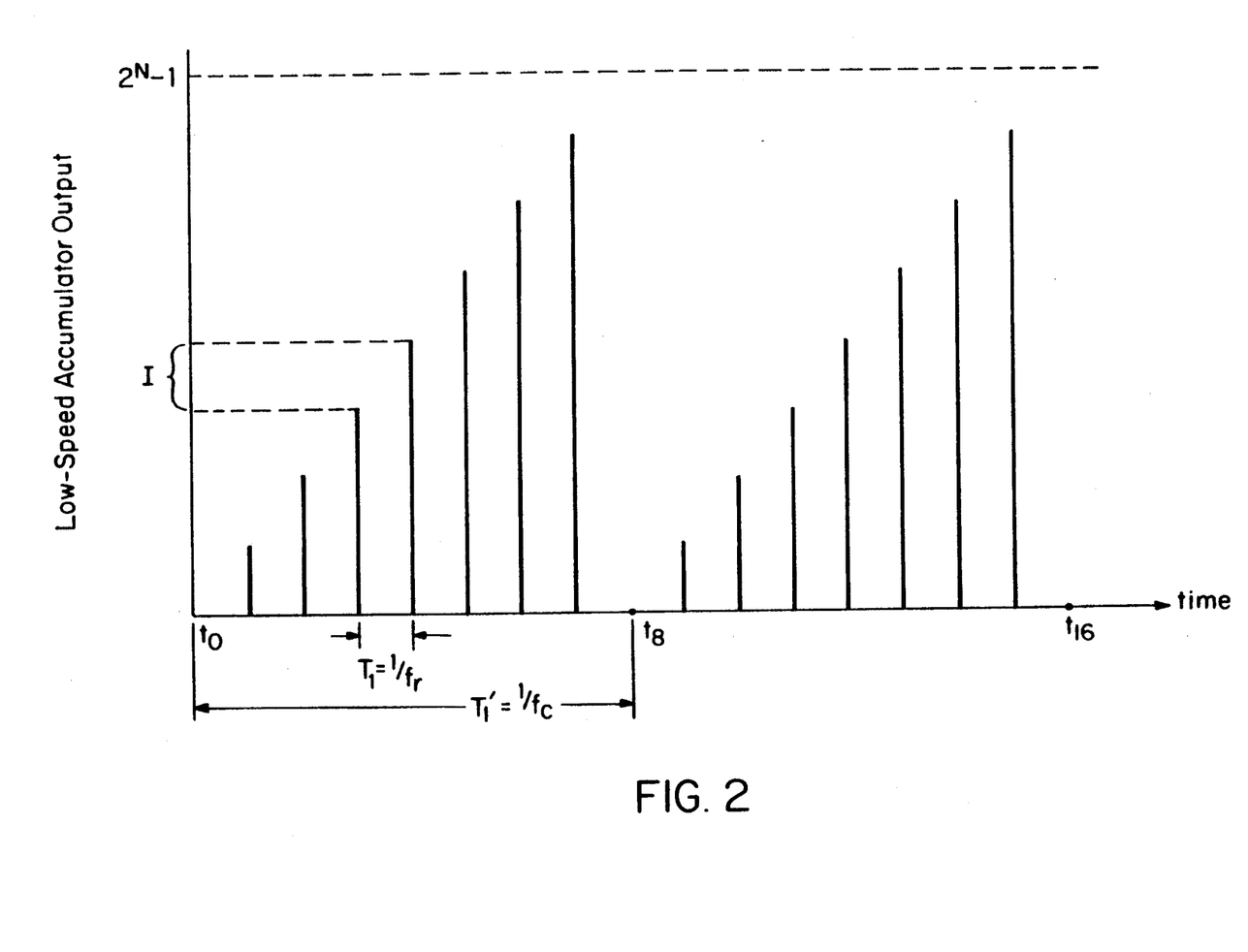
FIG. 2 is a graphical representation of the signal output from low-speed phase accumulator 12 of FIG. 1.

FIG. 2 shows a representative signal generated by the low-speed phase accumulator 12. Clock 1 generates a pulse every $T_1$ seconds, where $T_1$ is equal to $1/f_r$. On every clock pulse of clock 1, the low-speed phase accumulator 12 increments the N-bit register 13 by the phase shift increment, I. The N-bit register 13 overflow occurs every $T_1'$ seconds, where $T_1'$ is equal to $1/f_c$. In this case overflow occurs every eight clock pulses ($t_8$, $t_{16}$, . . . ). Therefore, the phase increment, I, is equal to $(2^N-1)/8$.

From the N-bits of low-speed phase accumulator 12, the MSB (not shown) is a sign bit, the next-most-significant bit (not shown) is the quadrant bit. Of the remaining N-2 bits, K bits of phase data is used to construct the first quadrant signal. The two MSBs use trigonometric identities to translate the first quadrant phase data to four quadrants of phase data. The larger the value of K the more phase resolution is available. The device has a high phase resolution if the low-speed accumulator has at least 20 bits of phase resolution (i.e. N is greater than or equal to 20).

The K-bits are used as an address into read only memory (ROM) 14,14'. Phase truncation occurs if K is less than N-2 because the resolution available in the N- (K+2) bits of the low-speed phase accumulator 12 is not available to the ROM 14,14'. The ROMs 14,14' contain $2^K$ address locations, each address containing an M-bit word.

For each phase value, the ROM 14,14' supplies a M-bit amplitude value. Amplitude quantization errors occur in the ROM 14,14' when the M bits are not sufficient to produce an exact amplitude change when the phase changes. In a preferred embodiment, ROM 14 is a sine function table and ROM 14' is a cosine function table. The ROMs 14,14' produce the quadrature components of the carrier signal, c(t), namely $$\begin{aligned} y(t) &= a_c(t)\sin\omega_c t \\ x(t) &= a_c(t)\cos\omega_c t \end{aligned} \qquad \text{(equation 4)}$$

Figure 3:
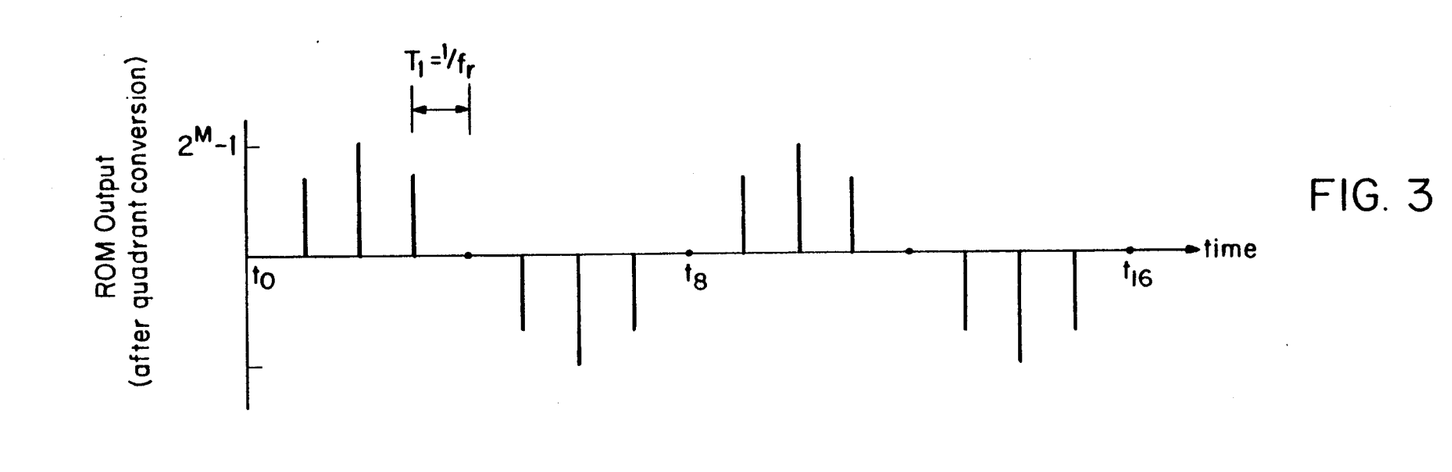
FIG. 3 is a graphical representation of the input signal into the digital-to-analog convertor (DAC) 16 of FIG. 1.

FIG. 3 shows a representative signal generated by ROM 14, y(t), after being translated into four quadrants. This signal is input into DAC 16. On every clock pulse, the ROM 14 computes an amplitude value from the phase accumulator 12 phase data. The amplitude values at $t_0$, $t_8$, and $t_{16}$ correspond to the respective phase data shown in FIG. 2. As in FIG. 2, the output signal period, $T_1$, is equal to eight clock pulses of clock 1.

Figure 4:
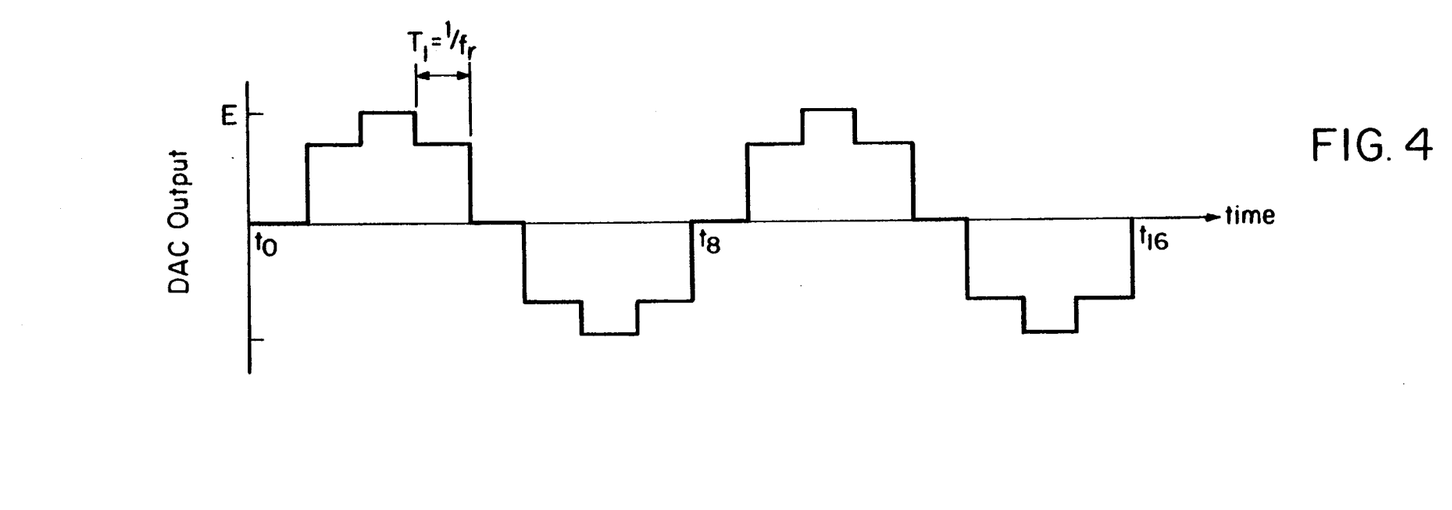
FIG. 4 is a graphical representation of the output from the DAC 16 of FIG. 1.

The digital signal from ROM 14,14' is converted to an analog signal by DAC 16,16'. FIG. 4 shows a representative signal generated by DAC 16. The maximum signal strength, E, is DAC dependent. The analog signals at time $t_0$, $t_8$, and $t_{16}$ correspond to conversion of the respective digital signals shown in FIG. 3. These analog signals are supplied on data busses 15 and 15' to be low pass filtered.

All the above-mentioned components suffer when driven at high clock frequencies. Higher frequencies lead to higher power consumption and thus higher levels of power dissipation. In addition, as the clock speed increases, the DACs 16,16' become more nonlinear. Furthermore, the DACs 16,16' create more severe glitches at higher clock frequencies because the glitch energy occupies a higher percentage of the clock cycle. Finally, higher clock speeds require the use of GaAs components instead of lower power CMOS components. A preferred embodiment uses a low-speed clock 1 to drive the low-speed phase accumulator 12. The frequency of clock 1 is chosen to take advantage of a low power logic system, such as used in CMOS devices. In a preferred embodiment, clock 1 is operated at a frequency of 50 MHz.

Conventional DDSs are available which provide the functions of the low-speed phase accumulator 12, the ROMs 14,14', and the DACs 16,16'. V. Manassewitsch, "Frequency Synthesizers Theory and Design" (John Wiley & Sons 1976), pps. 37-43, herein incorporated by reference, provides a more detailed discussion of conventional direct digital synthesizers. Adequate performance can be obtained by substituting a commercially available DDS 10. One adequate substitute is the STEL-1177 available from Stanford Telecom of Santa Clara, Calif. In particular, the STEL-1177 is a CMOS device using a 32-bit low-speed phase accumulator 12 (N=32) and provides 12 bits of phase resolution to the ROMs 14,14' (K=12). The ROMs 14,14' in turn provide 10 bits of amplitude resolution (M=10). Thus the conventional DDS 10 provides high phase and amplitude resolution.

The low pass filters 20,20' bandlimit the carrier signal output from the DDS 10 to a cutoff frequency. The carrier signal should be bandlimited to reduce the spur energy in the signal. The first significant spur occurs at the frequency given by the equation $$f_s = f_r - f_c \qquad \text{(equation 5)}$$

As $f_c$ approaches $f_r/2$, (the Nyquist frequency), the spur energy increases and may not be distinguishable from the signal energy. To avoid high near-carrier spur energy, conventional DDSs are typically operated to produce output frequencies of about 40% of the clock frequency.

Figure 5:
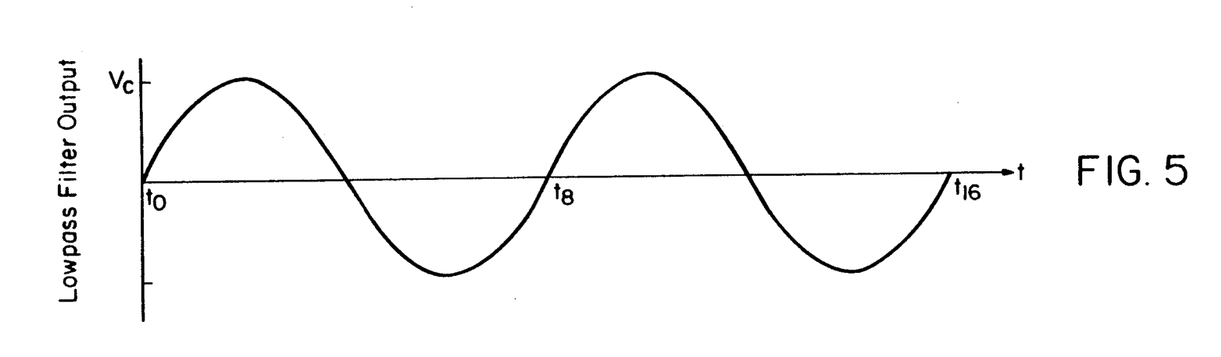
FIG. 5 is a graphical representation of the output from the low pass filter 20 of FIG. 1.

FIG. 5 shows a representative signal generated by low pass filter 20. The maximum signal strength is $V_c$. For an ideal lossless low pass filter, $V_c$ equals E. The analog signal at times $t_0$, $t_8$, and $t_{16}$ correspond to smoothing of the DAC signal data shown at the respective times in FIG. 4. The smoothed carrier signals from low pass filters 20,20' are fed to phase shifter 40 on data busses 25,25'.

The high-speed phase accumulator 30 uses clock 5 as a reference signal with frequency $f_r'$. The operation of the N'-bit high-speed phase accumulator 30 is similar to the previously described operation of the low-speed phase accumulator 12. In particular, the control unit 50 computes and supplies high-speed phase accumulator 30 with a phase increment on data bus 54. The control unit 50 calculates the phase increment from the frequency shift necessary to generate the selected output signal 7 by the equation $$I' = 2^{N'} \left( \frac{f_o - f_c}{f_r'} \right). \qquad \text{(equation 6)}$$

The high-speed phase accumulator's 30 N' bit register 31 supplies phase data to the phase shifter 40 on data bus 35.

In a preferred embodiment, the high-speed phase accumulator 30 has a 7-bit resolution (N'=7) and is driven by a 1.6 GHz clock. Because the high-speed phase accumulator 30 uses only 7-bits, the high-speed phase accumulator 30 is capable of providing only 2.8125 degrees of phase resolution and 12.5 MHz of frequency resolution. Thus, the high-speed phase accumulator 30 is a low resolution phase accumulator. The frequency of the high-speed phase accumulator 30 overflow is used to modulate the carrier signal 3.

Figure 6:
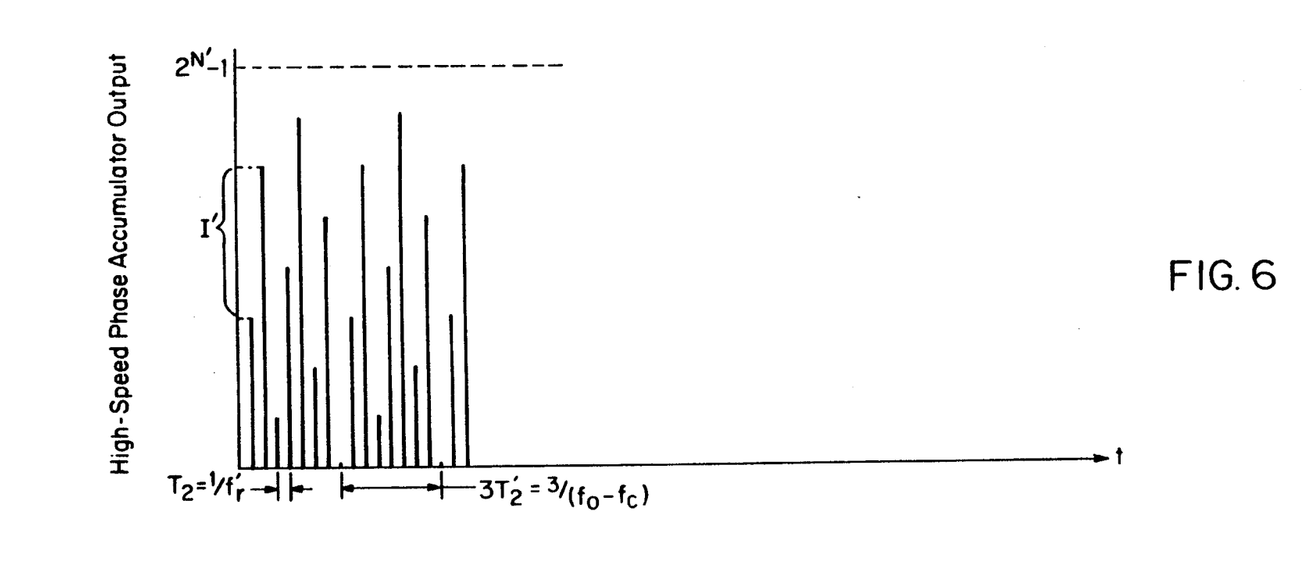
FIG. 6 is a graphical representation of the output from phase accumulator 30 of FIG. 1.

FIG. 6 shows a representative signal generated by high-speed phase accumulator 30, which is available on data bus 35. Clock 2 generates a pulse every $T_2$ seconds, where $T_2$ is equal to $1/f_r'$. On every clock pulse of clock 2, the high-speed phase accumulator 30 increments by the phase shift increment, I'. Overflow occurs every $T_2'$ seconds, where $T_2'$ is equal to $1/(f_o - f_c)$. In this case overflow occurs every two and two-thirds clock pulses. Therefore, the phase increment, I', is equal to $3*(2^{N'}-1)/8$. Indicated in FIG. 6 is a time period equal to three overflow periods.

Figure 7A:
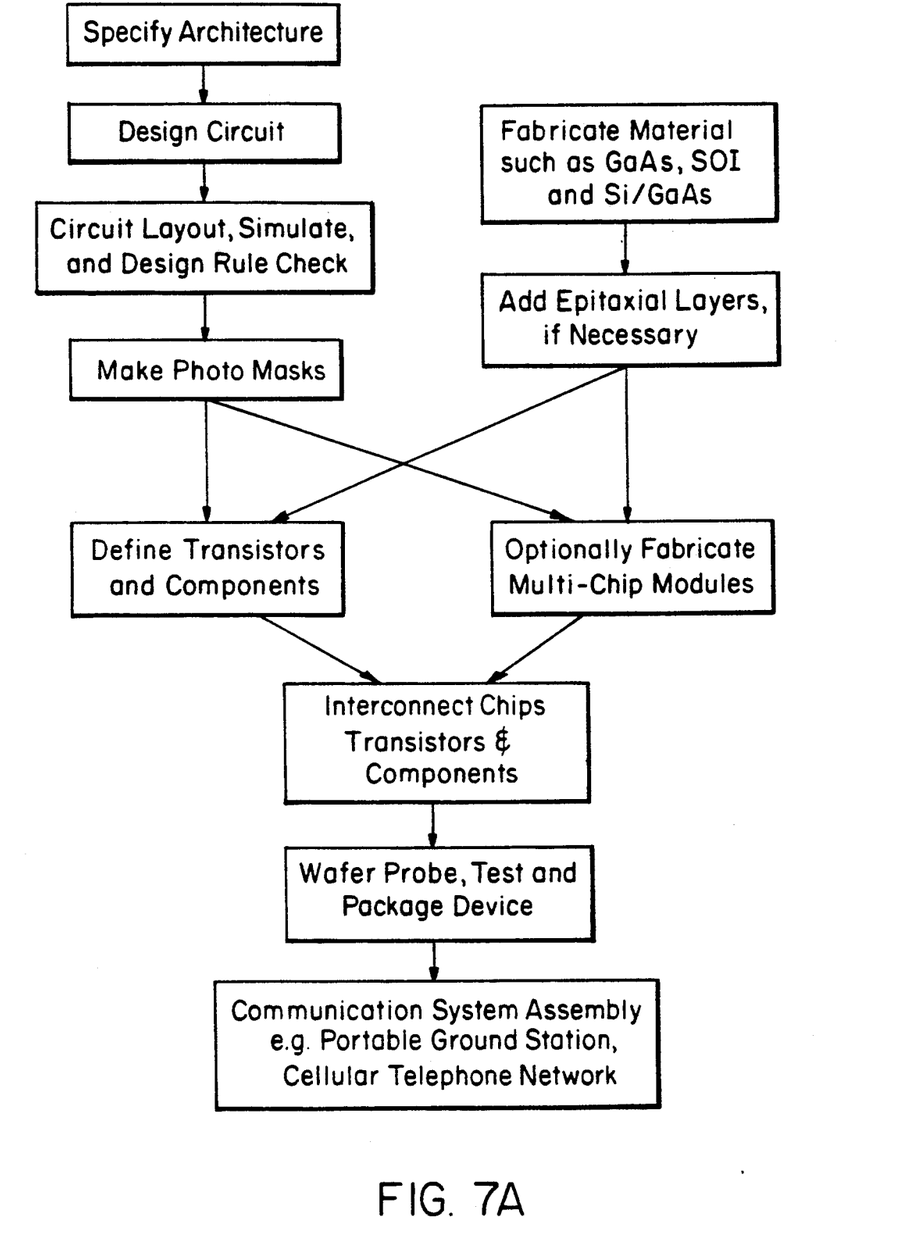
FIGS. 7A-7G are schematic diagrams of the process used to fabricate the invention shown in FIG. 1.
Figure 7B:
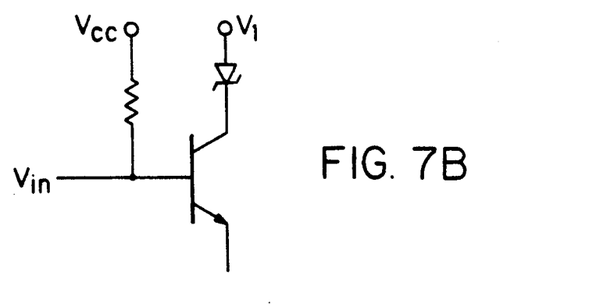

In a preferred embodiment, the high-speed accumulator 30 is fabricated as an integrated circuit 100 in a high-speed semiconductor material, such as GaAs. The use of GaAs fabrication allows the phase accumulator to operate at high frequencies. One well-suited fabrication process is Heterojunction Integrated Injection Logic (HI²L), as developed by Texas Instruments Incorporated. In the HI²L), configuration, transistors are configured as common-emitter-down Heterojunction Bipolar Transistors (HBT). FIGS. 7A-7G illustrate a preferred fabrication process. A general sequence suitable for use with different circuit designs and materials is shown in FIG. 7A. For illustration, the fabrication process will be explained with reference to fabricating the transistor circuit shown schematically in FIG. 7B. A number of other techniques known to those skilled in the art can also be employed.

Figure 7C:
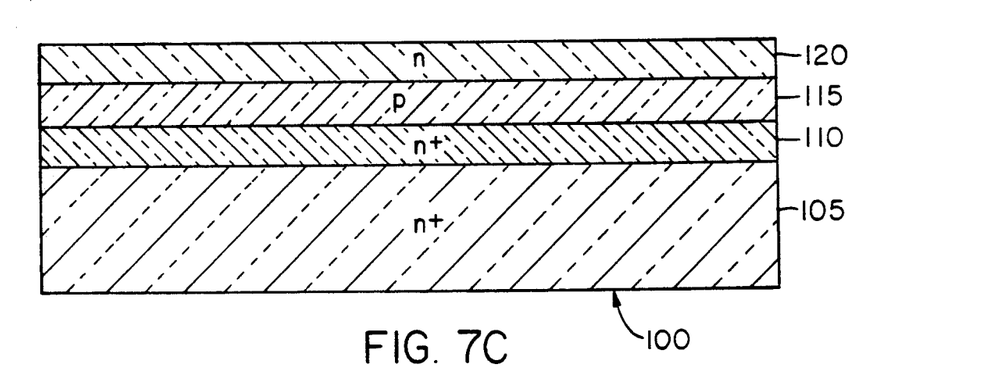

A conductive substrate 105 and epitaxial layers 110,115,120 are shown in FIG. 7C. These starting materials are Metalorganic Chemical Vapor Deposition (MOCVD) grown on a n+ GaAs substrate 105. The first epitaxial layer 110 is grown on the substrate 105 using n+ AlGaAs. This layer forms the transistor emitter. The second epitaxial layer 115 is grown using n⁻ GaAs implanted with a p-type dopant such as beryllium. This layer forms the transistor base. The third epitaxial layer 120 is grown using n GaAs. This layer forms the transistor collector.

Figure 7D:
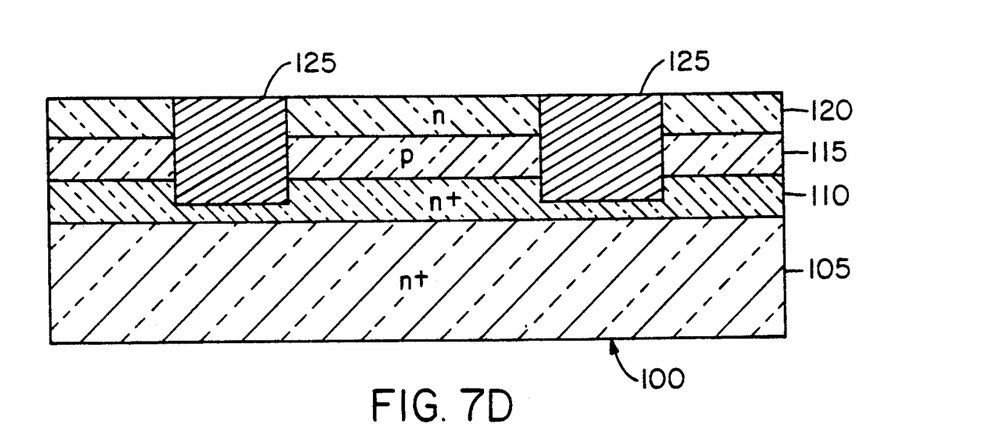
Figure 7E:
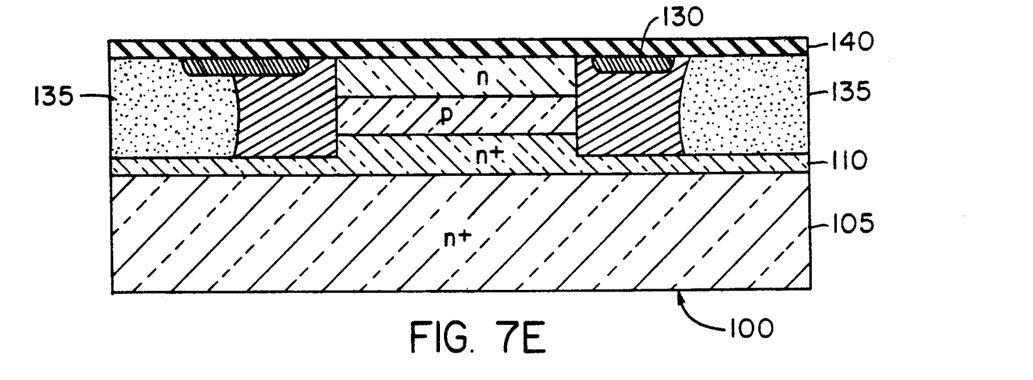

To provide p+ base contacts, a p-type dopant such as beryllium is implanted. The implantation regions 125 are shown in FIG. 7D. FIG. 7E shows the formation of a high surface zinc concentration 130 to improve the yield of p-ohmic base contacts. GaAs isolation regions 135 are then created by using a high-energy boron implant. Both the implantation regions 125 and the isolation regions 135 extend into but not through the first epitaxial layer 110, to provide for the common-emitter. A protective layer 140 of $Si_3N_4$ is then deposited over the surface.

Figure 7F:
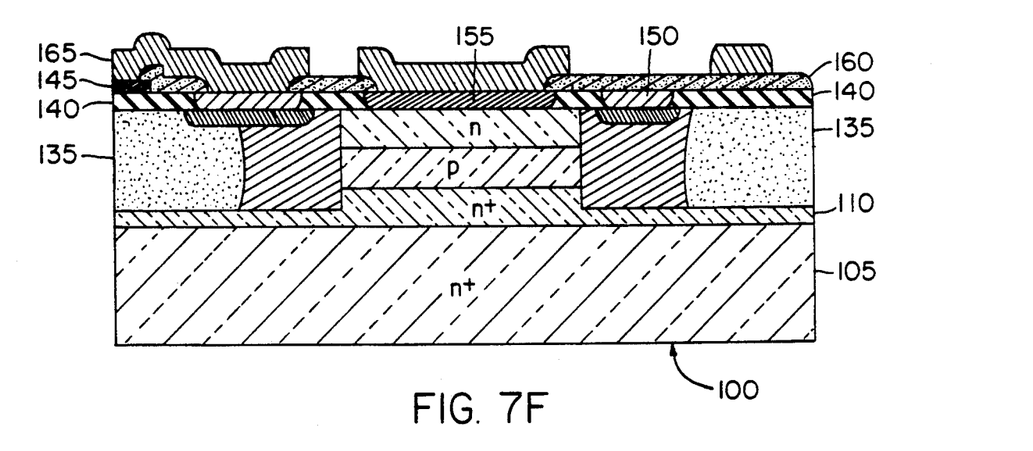

Turning to FIG. 7F, a cermet (CrSiO) thin-filmed resister 145 is then RF sputtered and ion milled onto the protective layer 140. The protective layer 140 is then selectively etched away to access the zinc surface 130 and collector region 120. A p-ohmic metal such as AuZn is deposited to create the base contacts 150. A Schottky diode contact 155 connected to the collector is provided by depositing TiPtAu as shown. The interconnect system is then formed with two dielectric-interconnect levels. Both interconnect levels use a $SiO_2$ dielectric and TiWAu interconnects. The first dielectric level 160 is deposited and etched. Optionally, either or both base contacts 150 could be accessed. The first interconnect level 165 is then deposited and etched.

Figure 7G:
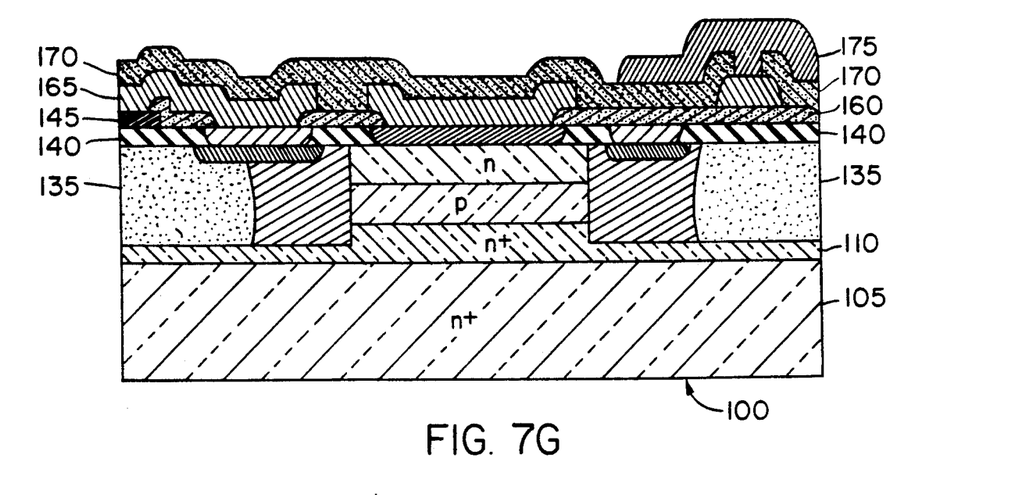

The second dielectric level 170 is deposited and etched as shown in FIG. 7G. Finally, the second interconnect level is deposited and etched.

By using the above-described technology, the invention realizes several advantages. Because all emitters 110 are common and connected to the conduction substrate 105, the only bus required is a power bus for $V_{in}$. The n+ substrate 105 also provides a solid ground. In addition, the Schottky collectors 155 provide for a large fanout for a transistor. Finally, power dissipation can be reduced by changing the value of the cermit resistor 145, which controls gate power. Some components, such as the low pass filters 20, 20', for example, may not be fabricated on the chip but can be externally connected or fabricated in a separate module. Thus different components can be fabricated as separate modules and then stacked and interconnected to form a multichip module.

Phase shifter 40 uses a serrodyne vector modulation technique to modulate carrier signal 3 by the phase from the high-speed phase accumulator 30. The vector-modulation phase shifter implementation is well suited for the present invention because the phase shifter 40 is constructed of radio frequency (rf) switches and passive attenuators. Both of those component types are inherently broadband and stable, thus providing high performance over a wide range of frequencies and operating temperatures.

The real-valued output signal, o(t), given in equation 2 can also be expressed by the equation $$o(t) = a_o(t)[\sin \theta(t) \cos \omega_c t + \cos \theta(t) \sin \omega_c t] \quad \text{(equation 7)}$$

where $a_o(t)$ denotes the amplitude (envelope) of the output signal, $\theta(t)$ denotes the periodic phase modulation, and $\omega_c$ denotes the carrier frequency in radians. If the phase shifter has a loss essentially independent of phase, then $a_o(t)$ can be expressed as $$a_o(t) = A a_c(t); \quad \text{(equation 8)}$$

where A denotes a know constant representing the loss. Using equation 8 and substituting the quadrature components, x(t) and y(t), of the carrier signal 3 into equation 6, we obtain $$o(t) = A[x(t) \sin \theta(t) + y(t) \cos \theta(t)]. \quad \text{(equation 9)}$$

The phase shifter 40 implements equation 9 to modulate the carrier signal 3. Control logic 42 obtains the phase shift data from the low-speed phase accumulator 30 on data busses 36,37. Data bus 36 carries the two MSBs from data bus 35. The two MSBs 36 control the quadrant selection switches 43,44. Data bus 37 carries the N'-2 remaining LSBs from data bus 35. The N'-2 LSBs 37 represent the first quadrant phase shift. The attenuators 46,48 compute the sine and cosine of the first quadrant phase shift using the N'-2 LSBs 37. The quadrant selection switches 43,44 translate the first quadrant attenuation values into appropriate attenuation values for each quadrant.

The quadrant selection switches 43,44 use well-known trigonometric identities to translate the first quadrant attenuation into four quadrant attenuation. Quadrant selection switch 43 controls the sign of cosine attenuator 46 and quadrant selection switch 44 controls the sign of sine attenuator 48. Table I lists the sign settings of the quadrant selection switches 43,44 for each value of the two MSBs 36.

TABLE I

| MSB | MSB-1 | Quadrant | Switch 43 | Switch 44 |
|---|---|---|---|---|
| 0 | 0 | 1 | + | + |
| 0 | 1 | 2 | + | − |
| 1 | 0 | 3 | − | − |
| 1 | 1 | 4 | − | + |

If an attenuator sign is negative, then the phase shifter 40 uses the quadrant selection switches 43,44 to invert the corresponding carrier signal component prior to attenuation. The switched sine component of carrier signal 3 is attenuated by cosine attenuator 46 and the switched cosine component of carrier signal 3 is attenuated by sine attenuator 48. The resulting output signal components are summed by adder 49 to produce the output signal, o(t), which is filtered by low pass filter 60.

The high-speed phase accumulator 30 synthesizes exact frequencies. The present invention has no phase truncation effects from the high-speed accumulator 30 because the attenuator network uses all N' bits. Additionally, due to the high-speed accumulator's 30 low resolution, the phase shifter 40 only needs a small number (i.e. $2^{N'}$) of first-quadrant phase states.

Figure 8:
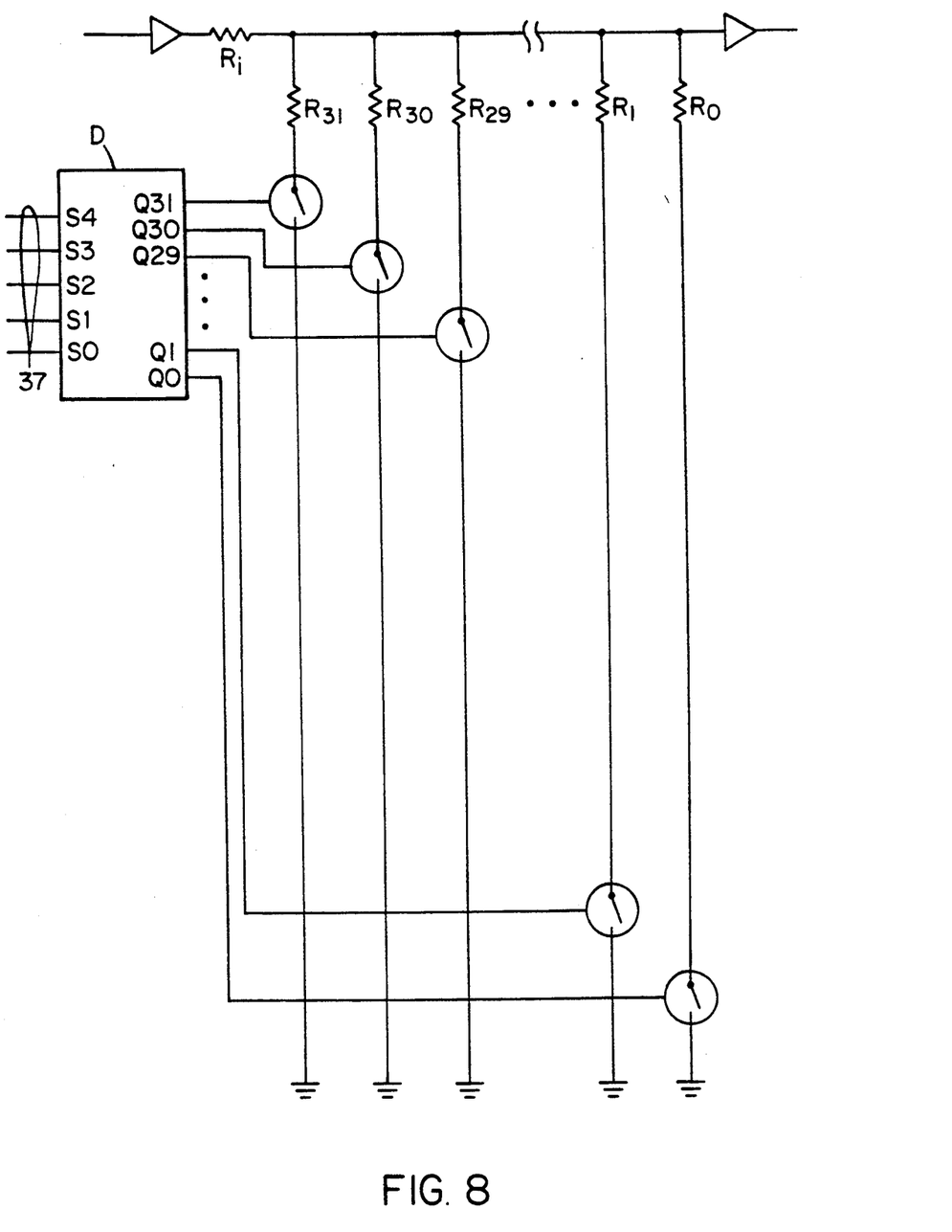
FIG. 8 is a block diagram of a preferred attenuator network.

FIG. 8 shows a preferred embodiment of the attenuator network. Because only 32 phase states are needed in a preferred embodiment, the attenuators $R_i$, $R_1 \ldots R_{31}$ can be realized as individual, exact attenuators $R_1 \ldots R_{31}$ for each phase state. By using exact attenuators $R_1 \ldots R_{31}$ a preferred embodiment eliminates any amplitude truncation effects.

In a preferred embodiment, the phase shifter 40 is fabricated in a high-speed semiconductor material, such as GaAs. The phase shifter 40 is fabricated on-chip with the high-speed accumulator 30. One approach is to implement the phase-shifter 40 using HI$^2$L technology. As previously mention in regard to the high-speed accumulator 30, HI$^2$L technology uses emitter-down transistors.

The use of both CMOS and GaAs components reduces the power demands of the present invention in comparison with conventional DDS systems. In a preferred embodiment, the present invention is fabricated as an integrated circuit using a high-density multi-chip module design as described earlier. The low-speed components (DDS 10, low pass filters 20,20', and control unit 50) can be fabricated on Si using CMOS technology. The high-speed components (phase accumulator 30 and phase shifter 40) are fabricated on GaAs. The two components can be formed in a GaAs on Si chip as well.

By fabricating the Si components on-chip with the GaAs components, the invention obtains certain advantages. During fabrication device parameters can be customized to accomplish optimal performance. For example, the size of the low-speed accumulator's 12 N-bit register 13 can be increased to allow for higher phase resolution. Likewise, the bit resolution of the ROMs 14,14' and OACs 16,16' can be customized. In addition to customization, single-chip fabrication reduces noise levels thus contributing to a purer signal.

Although the invention has been particularly shown and described with reference to a preferred embodiment thereof, it will be understood by those skilled in the art that various changes in form and details may be made therein without departing from the spirit and scope of the invention as defined by the appended claims.

Figure 9:
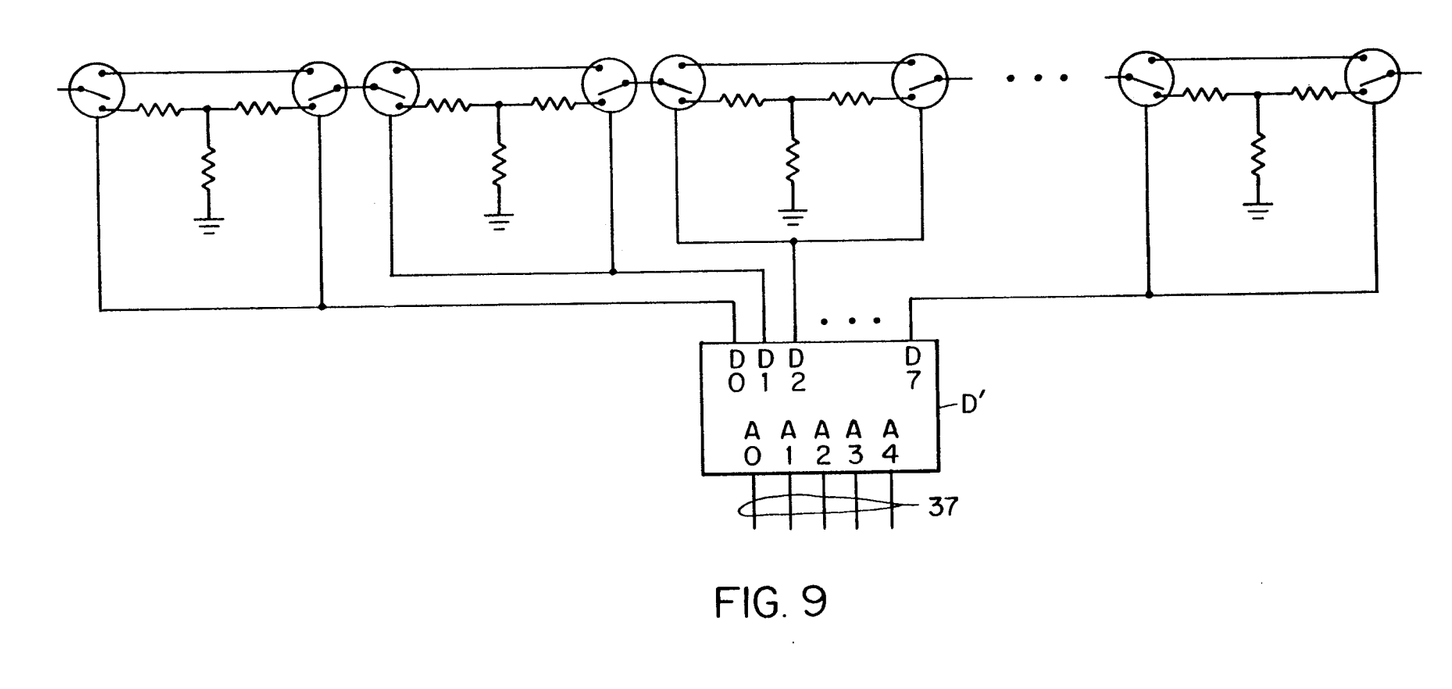
FIG. 9 is a block diagram of an alternative attenuator cascade.

As described, the invention uses decoded attenuators in the phase shifter 40. Alternatively, the invention could use a more conventional attenuator cascade as shown in FIG. 9. The attenuator cascade would require a sufficient number of bits to minimize the effect of amplitude quantization. Although attenuator and switch nonlinearities will be present, they will produce only a few, broadly spaced, spurious signals due to the small number of bits in the low-speed phase accumulator 30.

Figure 10:
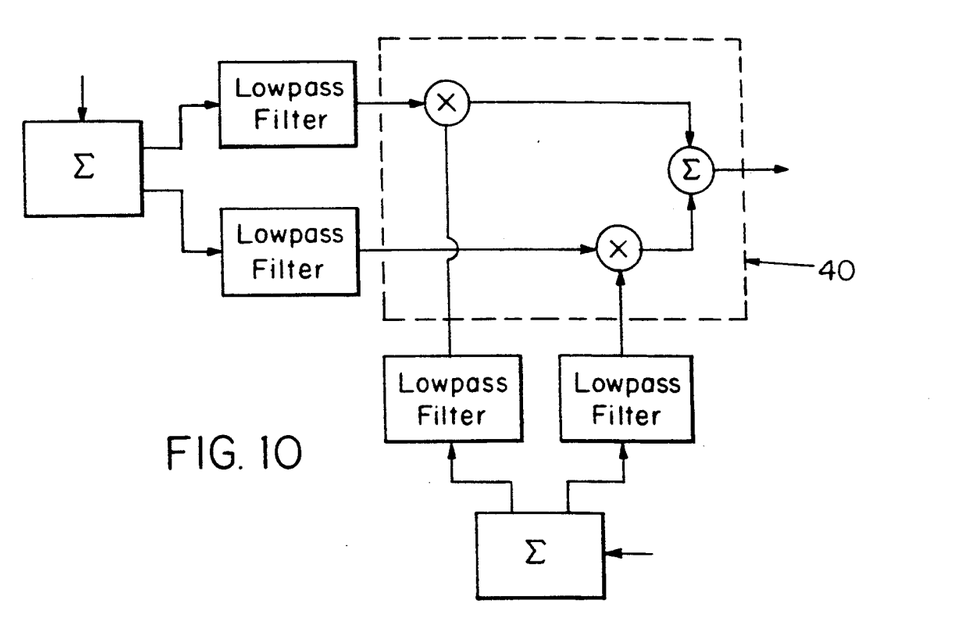
FIG. 10 is a block diagram of an alternative embodiment of the invention.

As described, the invention uses vector modulation techniques. FIG. 10 shows an alternative single-sideband (SSB) mixing embodiment. In many respects, the SSB-mixing alternative is similar to a preferred embodiment. Like in a preferred embodiment, the SSB-mixing alternative employs a low-speed, high-resolution DDS in conjunction with a high-speed, low-resolution phase accumulator. Like in a preferred embodiment, all needed phase shifts are obtained digitally and dc power is considerably reduced in comparison with conventional high-speed DDSs. Instead of using the two-channel switched-attenuator method of a preferred embodiment, the SSB-mixing approach uses two channels of high-speed ROMs, DACs, and low pass filters.

While the SSB-mixing approach may appear similar to a preferred embodiment, the SSB-mixing approach is inferior to a preferred embodiment. First, unless the mixers use true four-quadrant multipliers, a 3-1 mixer spur limits the bandwidth to a 3:1 range. In contrast, a preferred embodiment uses conventional mixers, but effectively removes the 3-1 spur by precise wave-shaping. The same is true for 5-1 and 7-1 spurs, etc. Secondly, the SSB-mixing approach requires two high-speed ROMs, whereas a preferred embodiment instead uses simpler decoders D,D'. Finally, the SSB-mixing approach requires two additional phase and amplitude matched low pass filters that a preferred embodiment does not need.

Although the fabrication process has been described in terms of HI$^2$L technology, there are other suitable alternatives. One such approach is Diode-HBT-Logic (DHL) being developed by Rockwell International. DH is implemented with GaAlAs/GaAs HBTs and Schottky diodes. Rockwell's approach utilizes a semi-insulating GaAs substrate.

EQUIVALENTS

Those skilled in the art will know, or be able to ascertain using no more than routine experimentation, many equivalents to the specific embodiments of the invention described herein.

These and other equivalents are intended to be encompassed by the following claims.

I claim:

1. An apparatus for synthesizing an output frequency within an output frequency band, comprising:
   a first circuit to provide an analog signal having a first frequency; and
   a second circuit having a digital phase shifter with an input frequency to vector modulate the analog signal generated by the first circuit, the input frequency of the second circuit being greater than the first frequency, and the second circuit generating the synthesized output frequency within an output frequency band extending at least one octave.

2. The apparatus of claim 1 further comprising a control unit electrically connected to the first circuit and the second circuit, the control unit selecting the first frequency of the first circuit and the input frequency of the second circuit based on the output frequency.

3. The apparatus of claim 1 wherein the first circuit and the second circuit are at least one integrated circuit.

4. The apparatus of claim 1 wherein the first circuit and the second circuit comprise a frequency synthesizer for a portable communication system.

5. The apparatus of claim 4 wherein the portable communication system is battery powered.

6. The apparatus of claim 5 wherein the system operates at 6 Watts or less of direct current power.

7. The apparatus of claim 5 wherein the system operates at 2 watts or less of direct current power.

8. The apparatus of claim 4 wherein the system has a weight of less than 3 lbs.

9. An apparatus for synthesizing an output frequency within an output frequency band, comprising:
   a first digital clock generating a first clock signal having a first clock frequency and a second digital clock generating a second clock signal having a second clock frequency;
   a direct digital synthesizer for generating an alternating electrical signal having a first computed frequency within a predefixed frequency band, from the first clock signal;
   a filter generating a carrier signal of the first computed frequency, the filter filtering the alternating electrical signal from the direct digital synthesizer;
   a phase accumulator for generating an electrical signal with a second computed frequency from the second clock signal;
   a phase shifter for generating the output frequency by vector modulating the carrier signal by the second computed frequency;
   an output filter for filtering the output signal from the phase shifter; and
   a control unit electrically connected to the direct digital synthesizer and the phase shifter.

10. The apparatus of claim 9 wherein the first clock frequency is less than the maximum frequency within the output frequency band, the second clock frequency is greater than the maximum frequency within the output frequency band, and the second clock frequency is an even multiple of twice the first clock frequency.

11. The apparatus of claim 10 wherein the alternating electrical signal comprises a first approximation and a second approximation of a sine wave, the second approximation being substantially 90 degrees out-of-phase with respect to the first approximation.

12. The apparatus of claim 9 wherein the low pass filter passes only frequencies substantially within the carrier frequency band.

13. The apparatus of claim 9 wherein the control unit computes the first and second computed frequencies based on the value of the output frequency.

14. The apparatus of claim 9 wherein the output filter passes only frequencies substantially within the output frequency band.

15. A method for synthesizing an output frequency within an output frequency band, comprising the steps of:
   generating a first clock signal from a first digital clock having a first clock frequency and a second clock signal from a second digital clock having a second clock frequency;
   computing a carrier wave frequency and a phase shift frequency from the output frequency;
   creating an alternating electrical signal from the first digital clock, the alternating electrical signal having a frequency substantially equal to the carrier wave frequency;
   filtering the alternating electrical signal to produce a smoothed signal;
   generating an electrical signal from the second digital clock, the electrical signal having a frequency substantially equal to the phase shift frequency;
   vector modulating the carrier signal with the electrical signal from the second digital clock to produce an output signal; and
   filtering the output signal.

16. The method of claim 15 wherein generating a second clock frequency comprises generating a signal with a frequency of an even multiple of twice the first clock frequency.

17. The method of claim 15 wherein creating an alternating electrical signal comprises creating a first and a second approximation of a sine wave, the second approximation being substantially 90 degrees out-of-phase with respect to the first approximation.

18. A communication system for transmission of a communication signal comprising:

a data processor for computing a transmission frequency within an output frequency band;

a first digital clock generating a first clock signal and a second digital clock generating a second clock signal;

a direct digital synthesizer for generating an alternating electrical signal having a first computed frequency within a predefined frequency band, from the first clock signal;

a filter generating a carrier signal of the first computed frequency, the filter filtering the alternating electrical signal from the direct digital synthesizer;

a phase accumulator for generating an electrical signal with a second computed frequency from the second clock signal;

a phase shifter for generating the output frequency by vector modulating the carrier signal by the second computed frequency; and a control unit electrically connected to the data processor, the direct digital synthesizer, and the phase shifter, the control unit computing the first and second computed frequencies.

19. The communication system of claim 18 wherein the transmission frequencies are frequency-hopped by the data processor.

20. The communication system of claim 18 wherein the frequency of the first clock signal is less than the maximum frequency within the output frequency band.

21. The communication system of claim 20 wherein the alternating electrical signal comprises a first approximation and a second approximation of a sine wave, the second approximation being substantially 90 degrees out-of-phase with respect to the first approximation.

22. The communication system of claim 18 wherein the filter passes only frequencies substantially within the known carrier frequency band.

23. The communication system of claim 18 wherein the frequency of the second clock signal is greater than the maximum frequency within the output frequency band.

24. The communication system of claim 18 wherein the control unit computes the first and second computed frequencies based on the value of the transmission frequency.

25. The communication system of claim 18 wherein the system comprises a cellular telephone network.

26. The communication system of claim 18 wherein the system comprises a portable ground station unit.

27. The communication system of claim 21 wherein the system is battery powered.

28. A cellular telephone network for transmission of a communication signal comprising;

a data processor for computing a transmission frequency within an output frequency band;

at least one digital clock generating a first clock signal and a second clock signal;

a direct digital synthesizer for generating an alternating electrical signal having a first computed frequency within a predefined frequency band, from the first clock signal;

a filter generating a carrier signal of the first computed frequency, the filter filtering the alternating electrical signal from the direct digital synthesizer;

a phase accumulator for generating an electrical signal with a second computed frequency from the second clock signal;

a phase shifter for generating the output frequency by vector modulating the carrier signal by the second computed frequency; and a control unit electrically connected to the data processor, the direct digital synthesizer, and the phase shifter, the control unit computing the first and second computed frequencies.

29. The cellular telephone network of claim 28 wherein the frequency of the second clock signal is greater than the maximum frequency within the output frequency band.

30. The cellular telephone network of claim 28 wherein the control unit computes the first and second computed frequencies based on the value of the transmission frequency.

31. The cellular telephone network of claim 28 wherein the transmission frequency is frequency-hopped by the data processor.

32. A portable ground station unit for transmission of a communication signal comprising:

a data processor for computing a transmission frequency within an output frequency band;

at least one digital clock generating a first clock signal and a second clock signal;

a direct digital synthesizer for generating an alternating electrical signal having a first computed frequency within a predefined frequency band, from the first clock signal;

a filter generating a carrier signal of the first computed frequency, the filter filtering the alternating electrical signal from the direct digital synthesizer;

a phase accumulator for generating an electrical signal with a second computed frequency from the second clock signal;

a phase shifter for generating the output frequency by vector modulating the carrier signal by the second computed frequency; and a control unit electrically connected to the data processor, the direct digital synthesizer, and the phase shifter, the control unit computing the first and second computed frequencies.

33. The ground station unit of claim 32 wherein the frequency of the second clock signal is greater than the maximum frequency within the output frequency band.

34. The ground station unit of claim 32 wherein the control unit computes the first and second computed frequencies based on the value of the transmission frequency.

35. The ground station unit of claim 32 wherein the transmission frequency is frequency-hopped by the data processor.

36. The ground station unit of claim 32 wherein the ground station is battery powered.

37. A battery-powered communication system for transmission of a communication signal comprising:

a data processor for computing a transmission frequency within an output frequency band;

at least one digital clock generating a first clock signal and a second clock signal;

a direct digital synthesizer for generating an alternating electrical signal having a first computed frequency within a predefined frequency band, from the first clock signal;

a filter generating a carrier signal of the first computed frequency, the filter filtering the alternating electrical signal from the direct digital synthesizer;

a phase accumulator for generating an electrical signal with a second computed frequency from the second clock signal;

a phase shifter for generating the output frequency by vector modulating the carrier signal by the second computed frequency; and a control unit electrically connected to the data processor, the direct digital synthesizer, and the phase shifter, the control unit computing the first and second computed frequencies.

38. The battery-powered communication system of claim 37 wherein the frequency of the second clock signal is greater than the maximum frequency within the output frequency band.

39. The battery-powered communication system of claim 37 wherein the control unit computes the first and second computed frequencies based on the value of the transmission frequency.

40. The battery-powered communication system of claim 37 wherein the transmission frequency is frequency-hopped by the data processor.

41. An integrated circuit for synthesizing an output frequency within an output frequency band, comprising:

a first circuit to provide an analog signal having a first frequency; and a second circuit having a digital phase shifter with an input frequency to modulate the analog signal generated by the first circuit, the input frequency of the second circuit being greater than the first frequency, and the second circuit generating the synthesized output frequency within an output frequency band extending at least one octave.

42. The integrated circuit of claim 41 wherein the first circuit comprises a direct digital synthesizer for generating the analog signal from a first clock signal.

43. The integrated circuit of claim 41 wherein the second circuit comprises a phase accumulator for generating an electrical signal of the input frequency from a second clock signal.

44. The integrated circuit of claim 41 further comprising a control unit electrically connected to the first circuit and the second circuit, the control unit selecting the first frequency of the first circuit and the input frequency of the second circuit based on the output frequency being synthesized.

45. An integrated circuit for digitally synthesizing an analog output frequency comprising:

a direct digital synthesizer having a first and a second analog output channel, the direct digital synthesizer interconnected to a first clock port;

a phase shifter having a first and a second analog input channel, an input port, and an output channel, the input channels coupled to respective output channels of the direct digital synthesizer; and a high-speed accumulator having an N' bit data register interconnected to the input port of the phase shifter, the accumulator interconnected to a second clock port, the data register supplying quadrant and phase data bits to the phase shifter.

46. The integrated circuit of claim 45 wherein the direct digital synthesizer comprises:

a low-speed phase accumulator having a N bit data register and interconnected to the first clock port;

a first ROM and a second ROM interconnected to the data registers of the low-speed phase accumulator, the ROMs comprising a table for converting the digital value of the data registers into a digitally encoded analog signal value, the second ROM providing data that is 90° out-of-phase relative to the first ROM data; and a first and a second digital-to-analog converter interconnected to respective ROMs for converting the digitally encoded analog signal value to an analog signal, the first digital-to-analog converter providing the first analog output channel and the second digital-to-analog converter providing the second analog output channel.

47. The integrated circuit of claim 46 wherein the ROM tables define a sine function.

48. The integrated circuit of claim 45 wherein the phase shifter comprises:

control logic interconnected to quadrant data bits of the high-speed accumulator's data registers;

a first and a second quadrant selection switch interconnected to the control logic, the first quadrant selection switch is interconnected to the first analog output channel of the direct digital synthesizer and the second quadrant selection switch interconnected to the second analog output channel of the direct digital synthesizer;

a first and a second gain element interconnected to the phase data bits of the high-speed phase accumulator, the first gain element interconnected to the first quadrant selection switch and the second gain element interconnected to the second quadrant selection switch; and a mixer interconnected to the first and the second gain elements for mixing the first and the second channels into an analog output signal.

49. The integrated circuit of claim 48 wherein the first and second gain elements comprise attenuator networks.

50. The integrated circuit of claim 45 further comprising a first and a second filter coupled between the direct digital synthesizer and the phase shifter, the first filter smoothing the signal on the first analog output channel and the second filter smoothing the signal on the second analog output channel.

51. The integrated circuit of claim 50 wherein the first filter and the second filter are low-pass filters.

52. The integrated circuit of claim 45 further comprising an output filter interconnected to the output of the phase shifter.

53. The integrated circuit of claim 52 wherein the output filter is a low-pass filter.

54. A method of synthesizing an output signal with a broad bandwidth from digital clock signals, comprising the step of:

vector modulating an analog carrier signal of a first frequency by a phase shift signal of a second frequency to produce the output signal, the second frequency being greater than the first frequency and the phase shift signal being tunable, wherein the broad bandwidth is at least one octave.

55. The method of claim 54 further comprising the step of tuning the carrier signal.

56. The method of claim 55 wherein the tuning step comprises tuning the carrier signal with a resolution of less than 1 Hz.

57. A method of synthesizing an output signal with an output bandwidth from digital clock signals, comprising the steps of:

synthesizing a tunable carrier signal of a first frequency from a first digital clock signal;

generating a tunable phase shift signal of a second frequency from a second digital clock signal, the second frequency being greater than the first frequency and vector modulating the carrier signal by the phase shift signal to produce an output signal wherein the output bandwidth exceeds one octave.

58. A direct digital synthesizer comprising;
at least one digital circuit module to synthesize an analog signal of an output frequency within an output frequency band of at least one octave from digital signals, the at least one digital circuit module having a first circuit to synthesize an analog signal of a first frequency and a second circuit to modulate the analog signal of the first frequency by a modulation signal of a second frequency greater than the first frequency, the second circuit having a digital phase shifter driven by the modulation signal, the modulation generating the synthesized output frequency; and
a filter module to low-pass filter at least one synthesized analog signal, the filter module coupled to the at least one digital circuit module.

59. The direct digital synthesizer of claim 58 wherein the digital circuit module is an integrated circuit.

* * * * *

UNITED STATES PATENT AND TRADEMARK OFFICE
CERTIFICATE OF CORRECTION

PATENT NO. : 5,303,412
DATED : April 12, 1994
INVENTOR(S) : Lawrence J. Kushner

It is certified that error appears in the above-identified patent and that said Letters Patent is hereby corrected as shown below:

At column 10, line 1, please delete "predefixed" and insert ---predefined---.

At column 10, line 27, please delete "low pass".

At column 15, line 7, please delete "comprising;" and insert ---comprising:---.

Signed and Sealed this

Twenty-sixth Day of November 1996

Attest:

BRUCE LEHMAN

Attesting Officer

Commissioner of Patents and Trademarks